(12) United States Patent
Peake et al.

(10) Patent No.: US 6,800,900 B2
(45) Date of Patent: Oct. 5, 2004

(54) TRENCH-GATE SEMICONDUCTOR DEVICES AND THEIR MANUFACTURE

(75) Inventors: Steven T. Peake, Warrington (GB); Georgios Petkos, Stockport (GB); Philip Rutter, Stockport (GB); Raymond J. Grover, Didsbury (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/213,460

(22) Filed: Aug. 6, 2002

(65) Prior Publication Data

US 2003/0047779 A1 Mar. 13, 2003

(30) Foreign Application Priority Data

Sep. 13, 2001 (GB) .............................................. 0122122

(51) Int. Cl.[7] .............................................. H01L 29/76
(52) U.S. Cl. ........................ 257/331; 257/331; 257/332
(58) Field of Search ................................ 257/331, 332, 257/333, 334, 401, 773, 907, 305

(56) References Cited

U.S. PATENT DOCUMENTS

| 6,087,224 A | 7/2000 | Luo ............................ 438/270 |
| 6,472,708 B1 * | 10/2002 | Hshieh et al. ............... 257/331 |

FOREIGN PATENT DOCUMENTS

| JP | 024193 | 1/2001 | ........... H01L/29/78 |
| WO | WO00065646 | 2/2000 | ........... H01L/21/76 |

OTHER PUBLICATIONS

Patent Abstracts of Japan, Oishi Kentaro: "Semiconductor Device And Its Manufacture" Publication No. 2000277531, Jun. 10, 2000, Application No. 11081667, Mar. 25, 1999.

* cited by examiner

Primary Examiner—David Nelms
Assistant Examiner—Thinh T. Nguyen
(74) Attorney, Agent, or Firm—Aaron Waxler

(57) ABSTRACT

A device termination structure, and/or a gate bus-bar structure, and/or other end structure is provided for at least one group of cells in a cellular trench-gate semiconductor device, for example a power MOSFET. In this end structure, a conductive layer (11c), for example of polysilicon gate material, extends on an intermediate insulating layer (55) over a higher-doped (P+) end region (150) of the channel-accommodating region (15). This insulating layer (55) comprises an area (51e) of a trench-etch mask (51), preferably comprising silicon nitride, that is of greater thickness than the gate dielectric layer (17). A window (51a) extends through the trench-etch mask (51) at a location where an end trench (20e) extends into the P+ region (150). The end trench (20e) is an extension of the insulated gate trench (20) into the P+ region (150) and accommodates an extension (11e) of the trench-gate (11). The conductive layer (11c) is connected to the trench-gate extension (11e) via the window (51e). The lateral extent of the conductive layer (11c) terminates in an edge (11a,11b) that is defined on the trench-etch mask (51).

17 Claims, 7 Drawing Sheets

TRENCH-GATE SEMICONDUCTOR DEVICES AND THEIR MANUFACTURE

This invention relates to trench-gate semiconductor devices, for example power MOSFETs (insulated-gate field-effect transistors), and their manufacture.

Published Japanese patent application Kokai JP-A-2001-24193 and its English-language abstract in Patent Abstracts of Japan describe cellular trench-gate semiconductor devices comprising active device cells in a cellular area of a semiconductor body, and a device termination structure that extends around the whole perimeter of the cellular area. The whole contents of Kokai JP-A-2001-24193 and its said English-language abstract are hereby incorporated herein as reference material.

Each active device cell has a channel-accommodating region of a second conductivity type between a surface-adjacent source region and an underlying drain region that are of a first conductivity type. An insulated gate trench accommodating the trench-gate extends from the source region through the channel-accommodating region and into the underlying drain region. The trench-gate is dielectrically coupled to the channel-accommodating region by an intermediate gate dielectric layer at sidewalls of the gate trench.

The particular device termination structures disclosed in JP-A-2001-24193 include:
- an end region 4($p$) of the second conductivity type having a higher doping concentration than the channel-accommodating region 8($p$),
- an end trench 5B that is an extension of the insulated gate trench 5A into the end region 4($p$) and that accommodates an extension 7B of the trench-gate 7A,
- and a conductive layer 7C that is connected to the extension of the trench-gate and extends over an intermediate insulating layer 3,6 over the end region 4($p$).

As taught in JP-A-2001-24193, the end region 4($p$) may be deeper or shallower than the channel-accommodating region 8($p$), and the end trench 5B may be deeper or shallower than the end region 4($p$). The conductive layer 7C forms an outwardly-extending field plate on the intermediate insulating layer 3,6. In these known devices, the intermediate insulating layer comprises a thick LOCOS field oxide 3 around a thinner oxide layer 6 that is present on the end region 4($p$). The thick field oxide 3 is present over the outer perimeter of the end region 4($p$) and over a portion of the drain region 2($n$) beyond the end region 4($p$). The thinner oxide layer 6 is formed simultaneously with the gate dielectric 6 in the devices of JP-A-2001-24193, after removing the trench-etch mask RE1.

It is an aim of the present invention to provide a more substantial insulating layer (preferably comprising silicon nitride) between the high-doped end region and the overlying conductive layer, and particularly to provide a thicker insulating layer that may be used in self-alignment of device features in manufacture (for example, the source region and/or an insulating capping layer with respect to the gate trench).

According to a first aspect of the invention, the resulting device is characterised in that:
- the intermediate insulating layer comprises an area of a trench-etch mask (preferably comprising silicon nitride) that is of greater thickness than the gate dielectric layer,
- a window extends through the trench-etch mask at a location where the end trench extends into the body and where the conductive layer is connected to the trench-gate extension, and
- the conductive layer has a lateral extent that terminates in an edge on the trench-etch mask.

The area of trench-etch mask is recognisable in the final device by its window from which the end trench extends into the body. Keeping this mask area can benefit both manufacture of the device and the final device structure.

Thus, the trench-etch mask area is a better interface (than a thin gate-dielectric layer area) on which to deposit and pattern the conductive layer that is connected to the trench-gate. This is particularly important for defining an edge of the conductive layer facing the cellular area. If this edge of the conductive layer is defined by etching on a gate-dielectric layer area (as in JP-A-2001-24193), there is a risk of etching through (or otherwise damaging) the thin gate-dielectric layer area, so degrading the insulation on the high-doped end region and possibly also in other areas (for example, active device cell areas). These areas are protected in the manufacture of a device in accordance with the invention, by keeping the trench-etch mask during this stage. Keeping the respective trench-etch mask area on the end region in the final device also provides a better insulation scheme, which is beneficial in different scenarios.

In one scenario, the end structure extends between two groups of active device cells as a stripe that includes a metal track to reduce the gate connection resistance for these groups of active device cells. Such a scheme may be termed a gate "bus-bar" or gate "runner" structure. A simple construction is possible in which the thick trench-etch mask area provides at least the bulk of the insulation needed between the gate bus-bar and the underlying high-doped end region. Nonetheless, when the device termination additionally includes a field insulator, an area of the field insulator may be incorporated also under the trench-mask as extra insulation between the metal track and the underlying high-doped end region.

In another scenario, the respective end structure extends around the perimeter of the cellular device area as a device termination. Thus, inter alia, there can be achieved advantageous modifications of the device termination schemes disclosed in JP-A-2001-24193. In this scenario, the high-doped end region may have an outer perimeter that terminates in a field insulator onto which the trench-etch mask extends. An outwardly-extending field-plate may extend over the field insulator, over a part of the drain region outside the outer perimeter of the end region. This field-plate can be connected to the trench-gate via the conductive-layer connection at the end trench.

The trench-etch mask area may be composed of a single insulating material. Preferably, a multiple-layer composition of different materials is used, which can provide insulation of a high integrity and of a reduced susceptibility to etching or other degradation during the device processing stages. Thus, for example, the trench-etch mask may comprise a thick layer of silicon nitride on a thin stress-relieving layer of silicon dioxide. A further layer of silicon dioxide may be present on the thick nitride layer as a part of the intermediate insulating layer.

The gate dielectric of the device may comprise a thin thermally grown oxide, and/or it may comprise a deposited layer. In this latter case, an area of the deposited gate dielectric layer can be present on the area of the trench-etch mask below the conductive layer thereon.

The trench-etch mask generally comprises a thick layer of deposited material, advantageously silicon nitride, which (as described in detail below) has less of a dopant-depletion effect on the underlying high-doped end region than does the thermal growth of a thick oxide. This thick silicon nitride mask area can be incorporated into the device termination structure to avoid growing a thick field oxide. If a thick oxide is included as a field insulator, this oxide is preferably deposited. In a particularly advantageous and compact termination structure, the thick deposited insulator may be accommodated within a deeper, wide field trench at the outer perimeter of the termination region of the second conductivity type. The trench-etch mask may extend directly on this oxide-filled termination trench.

According to a second aspect of the present invention, there is provided a method of manufacturing a cellular trench-gate semiconductor device having one or more end structures (for example, for a gate bus-bar and/or device termination) in accordance with the first aspect. Such a method preferably includes the process steps set out in claim 18. The gate material may be patterned to define the conductive layer on the trench-etch mask. Thereafter, the trench-etch mask and its windows may be used to provide device features (for example, the source region and/or an insulating capping layer on the trench-gate) in a self-aligned manner with respect to the gate trench.

The present invention is compatible with self-alignment techniques of the advantageous manufacturing method disclosed in U.S. Pat. No. 6,087,224 (our reference PHB34245). In this method, sidewall extensions (spacers) are provided at the trench-etch mask windows and are used for self-alignment processing at different stages. By this means, narrow trench-gates can be formed (narrower than the window), and the source region and a contact window for a source electrode can be determined in a self-aligned manner with respect to this narrow trench. The whole contents of U.S. Pat. No. 6,087,224 are hereby incorporated herein as reference material.

Various advantageous features in accordance with the present invention are set out in the appended claims. These and others are illustrated in embodiments of the invention that are now described, by way of example, with reference to the accompanying diagrammatic drawings, in which:

Figure 14:
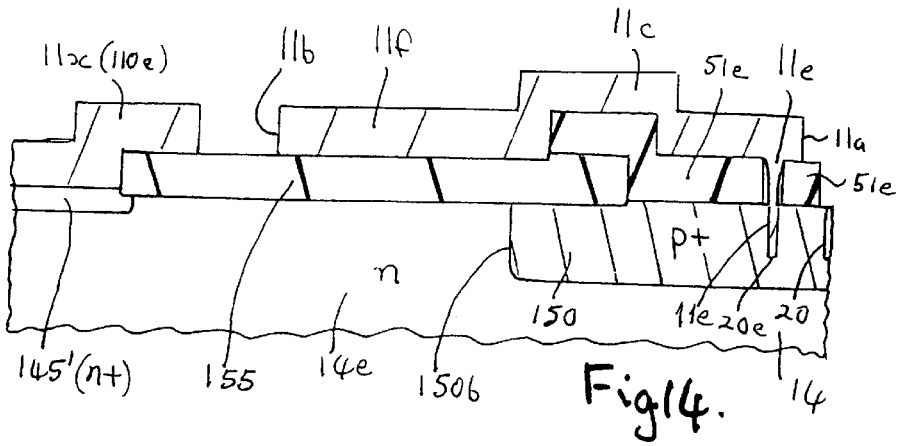
Figure 15:
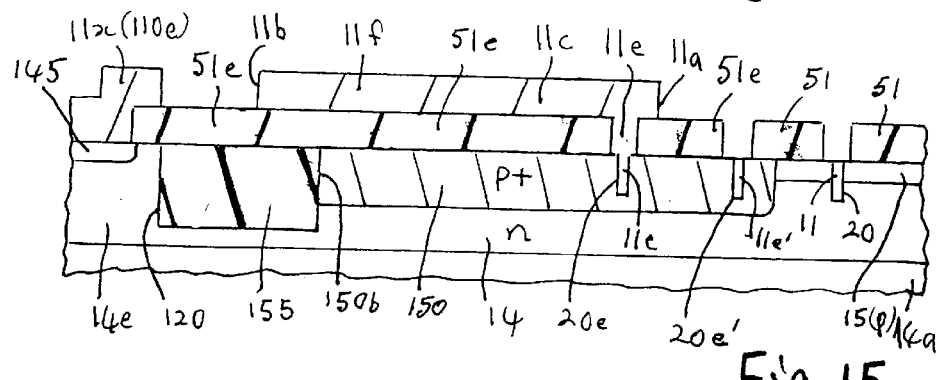
Figure 16:
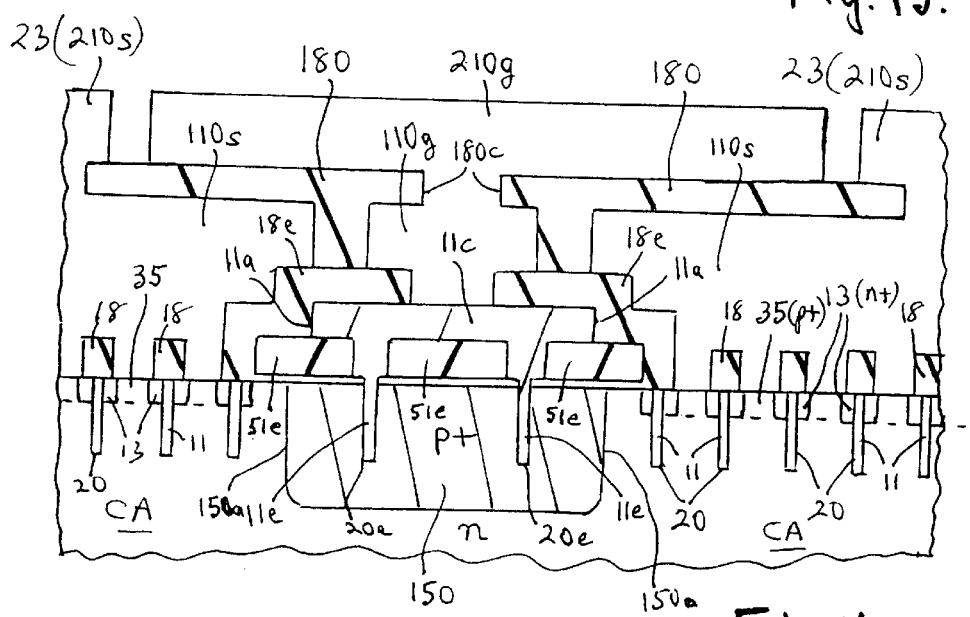

FIGS. 14 and 15 are cross-sectional views of two different device terminations (i.e. some similarity to that of FIG. 2), showing modifications that are also in accordance with the present invention; and FIG. 16 is a cross-sectional view of a gate bus-bar structure (i.e. with some similarity to that of FIG. 3) and also a gate pad, showing modifications that are also in accordance with the present invention.

All the drawings are diagrammatic, with the relative dimensions and proportions of various parts of these Figures being shown exaggerated or reduced in size, for the sake of clarity and convenience in the drawings. Thus, for example, the different depictions of the same trenches in FIGS. 2 & 3 and FIGS. 4 & 5 illustrate the degree to which the proportions are exaggerated or reduced in respective drawings, for convenience of drawing area. The same reference signs are generally used to refer to corresponding or similar features in modified and different embodiments. Similar reference signs to those of U.S. Pat. No. 6,087,224 are used for ease of comparison of these embodiments of the present invention with the self-aligned process and device of U.S. Pat. No. 6,087,224.

FIGS. 1 to 5 illustrate an exemplary embodiment of a cellular power MOSFET device in accordance with the present invention. In the cellular areas CA of this device, each transistor cell has a channel-accommodating region 15 of a second conductivity type (p-type in this example) that separates source and drain regions 13 and 14, respectively, of a first conductivity type (n-type in this example). The drain region 14 is common to all the cells. The device has a trench-gate 11 in an insulated trench 20 that extends through the regions 13 and 15 into an underlying portion of the drain region 14. The gate 11 is capacitively coupled to the region 15 by an intermediate dielectric layer 17 at the walls of the trench 20. The application of a voltage signal to gate 11 in the on-state of the device serves in known manner for inducing a conduction channel 12 in the region 15 and for controlling current flow in this channel 12 between the source and drain regions 13 and 14.

The source region 13 is located adjacent to the top major surface 10a of the device body 10, where regions 13 and 15 are contacted by a source electrode 23. The trench-gate 11 is insulated from the overlying electrode 23 by an intermediate insulating overlayer 18 (sometimes termed "capping" layer 18). Typically the MOSFET of FIGS. 1 to 5 is a vertical power device structure, as are those depicted in U.S. Pat. No. 6,087,224. The region 14 is a drain-drift region, which may be formed by an epitaxial layer of high resistivity on a more highly-doped substrate 14a of the same conductivity type. The substrate 14a is contacted at the bottom major surface (10b in U.S. Pat. No. 6,087,224) of the device body 10 by a drain electrode (24 in U.S. Pat. No. 6,087,224).

Typically the device body 10 is of monocrystalline silicon, and the gate dielectric layer 17 is typically of thermally grown silicon dioxide or of deposited silicon dioxide. Typically, the trench-gate 11 is of conductively-doped polysilicon.

The specific cellular device shown in FIGS. 1 to 5 comprises three groups of the cells (in three respective areas CA of FIG. 1), each of which ends in a respective end structure. The end structure is either an edge termination (FIG. 2) in the annular peripheral area PA of the device or a gate bus-bar stripe structure (FIG. 3) that extends between neighbouring cellular areas CA. In each case, the end structure includes:

an end region 150 of the second conductivity type (i.e. p-type in this example) having a higher doping concentration P+ than the channel-accommodating region 15, an end trench 20e that is an extension of the insulated gate trench 20 into the P+ region 150 and that accommodates an extension 11e of the trench-gate 11, and a conductive layer 11c that is connected to the gate extension 11e and extends over an intermediate insulating layer 55 over the P+ region 150. This layer 11c is typically an extension of the conductive semiconductor material of the gate 11.

In accordance with the present invention, these respective end structures of this device of FIGS. 1 to 5 are constructed as follows:

the insulating layer 55 comprises an area 51e of a trench-etch mask 51 that is of greater thickness than the gate dielectric layer 17, a window 51a extends through the trench-etch mask 51 at a location where the end trench 20e extends into P+ region 150 and where the conductive layer 11c is connected to trench-gate extension 11e, and the conductive layer 11c has a lateral extent that terminates in an edge 11a, 11b on the trench-etch mask 51.

Figure 1:
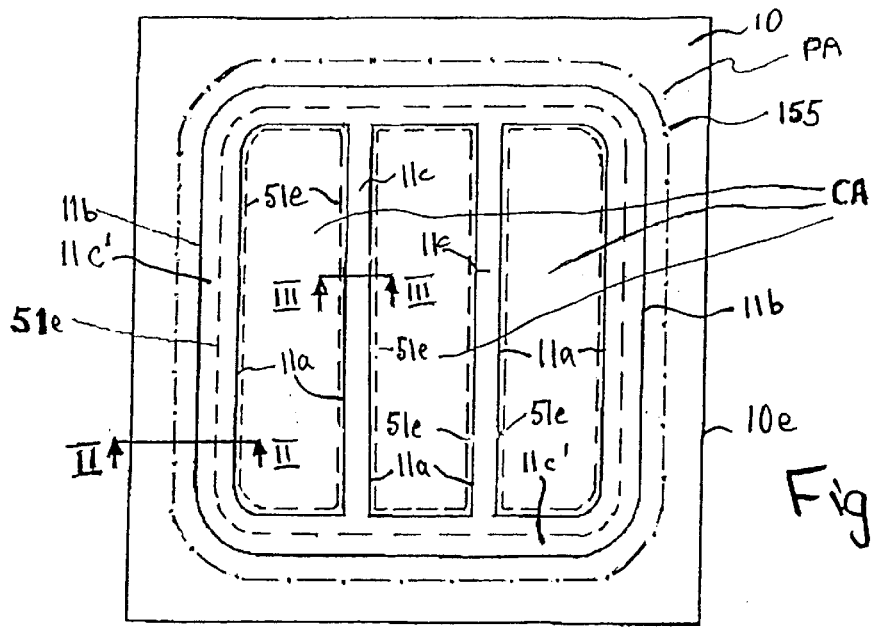
FIG. 1 is a simple plan view of one example of a trench-gate semiconductor device in accordance with the invention, showing both edge-termination and bus-bar configurations at the gate-connection level on top of trench-etch mask areas.
Figure 4:
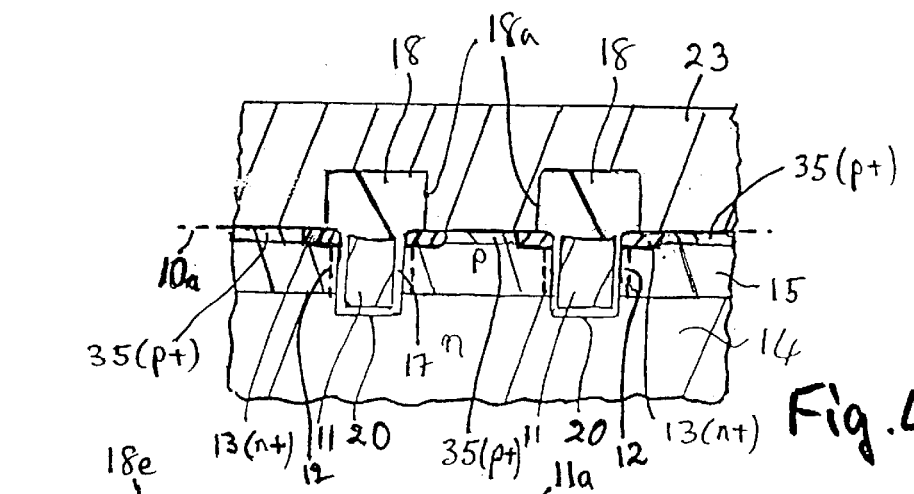
FIGS. 4 and 5 are enlarged cross-sectional views of parts of an active-cell area and an end-structure area respectively of FIGS. 1 to 3.

The simple plan view of FIG. 1 is taken at the level of the layer 11. It indicates in solid outline the edges 11a, 11b of the conductive layer 11c, and in broken outline the edges of the trench-etch mask area 51e. Edges 11a are inner perimeters of the conductive layer 11c that face the cellular areas CA, whereas the edge 11b is its outer perimeter that faces the edge 10e of the device body 10. In its peripheral area PA, FIG. 1 also indicates in chain-dot outline the outer perimeter of an annular field insulator 155.

Figure 2:
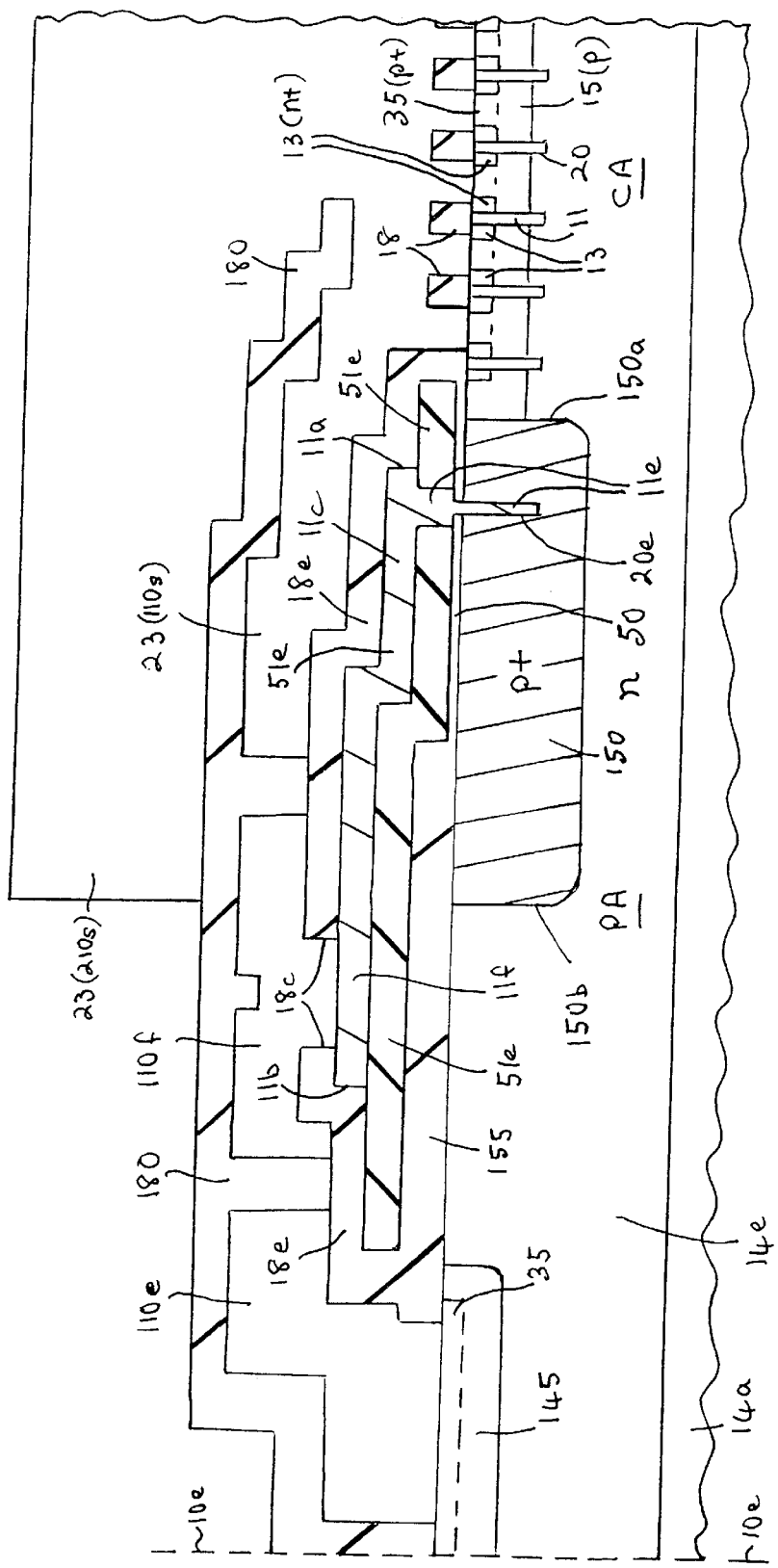
FIG. 2 is a cross-sectional view of one example of edge termination for such a device as that of FIG. 1, taken on the line II—II of FIG. 1.

The device termination structure of FIG. 2 has an annular geometry for its parts 155, 150, 51e, 20e, 11e, 11c etc. It extends around the whole peripheral area PA of the device. Its annular P+ region 150 has an inner perimeter 150a that adjoins the neighbouring cell region 15 (and so is connected thereto) and an outer perimeter 150b that terminates in the field insulator 155. Annular area 51e of the trench-etch mask 51 extends over this P+ region 150 and onto the field insulator 155. An outwardly-extending annular field-plate 110f, 11f extends over the field insulator 155, over a part 14e of the drain drift region 14 outside the outer perimeter 150b of P+ region 150. The field-plate 110f, 11f is connected to trench-gate 11 via layer parts 11c and 11e and trench-extension 20e. FIG. 2 shows an embodiment in which this field-plate is simply an extension 11f of the conductive semiconductor material of the gate 11, but with a metal runner 110f thereon to reduce its resistance. The device termination also includes an inwardly-extending annular field-plate 110e that is connected to an annular perimeter region 145 outside the outer perimeter of field insulator 155.

Figure 3:
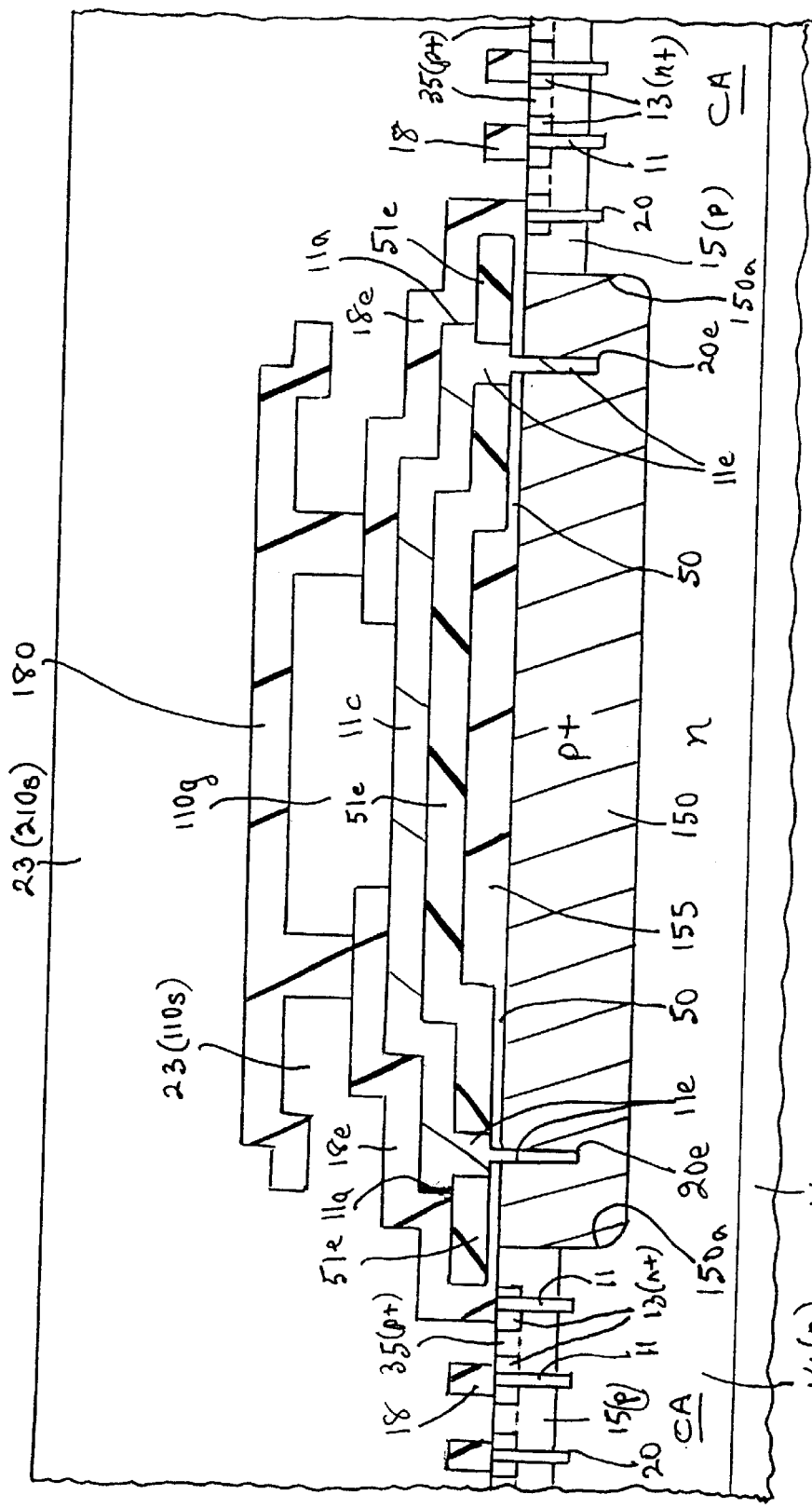
FIG. 3 is a cross-sectional view of a corresponding example of an inside part of such a device as that of FIG. 1, taken on the line III—III of FIG. 1, i.e. through a gate bus-bar structure.

The gate bus-bar structure of FIG. 3 has a stripe geometry for its parts 155, 150, 51e, 20e, 11e, 11c etc. It extends as stripes across the cellular device, between neighbouring groups of active device cells. It includes a metal track 110g extending on the conductive semiconductor layer stripe 11c. This provides a gate connection of reduced electrical resistance for the cell groups in their respective areas CA. This layer stripe 11c is entirely present on a stripe-shaped area 51e of the trench-etch mask 51 over stripe-shaped P+ region 150. The two longitudinal-side perimeters 150a of this stripe-shaped P+ region 150 adjoin the neighbouring cell regions 15, so connecting this region 150 thereto.

These respective end schemes of FIGS. 2 and 3 each comprise a common sequence of regions and layers 14, 150, 50, 51, 17, 11, 110, etc. As such, both the device termination structure and the gate bus-bar structure can be formed simultaneously using common process steps.

Figure 6:
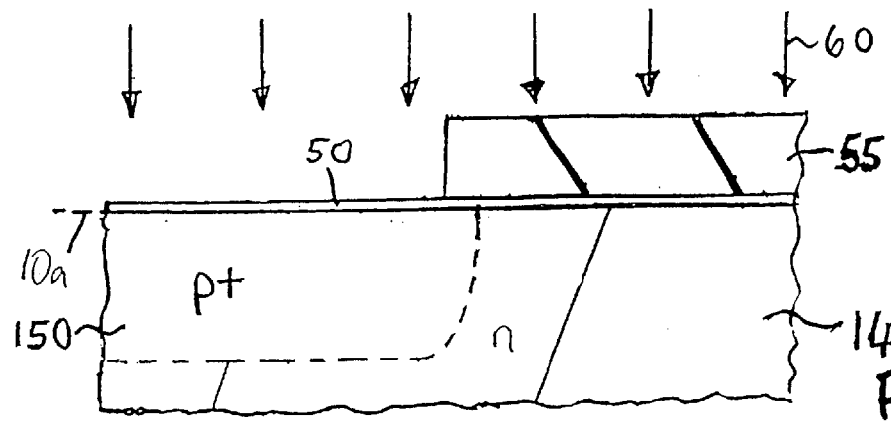
FIGS. 6 to 11 are cross-sectional views of the device part of FIG. 5 at successive stages in its manufacture by one example of a method in accordance with the present invention.
Figure 8:
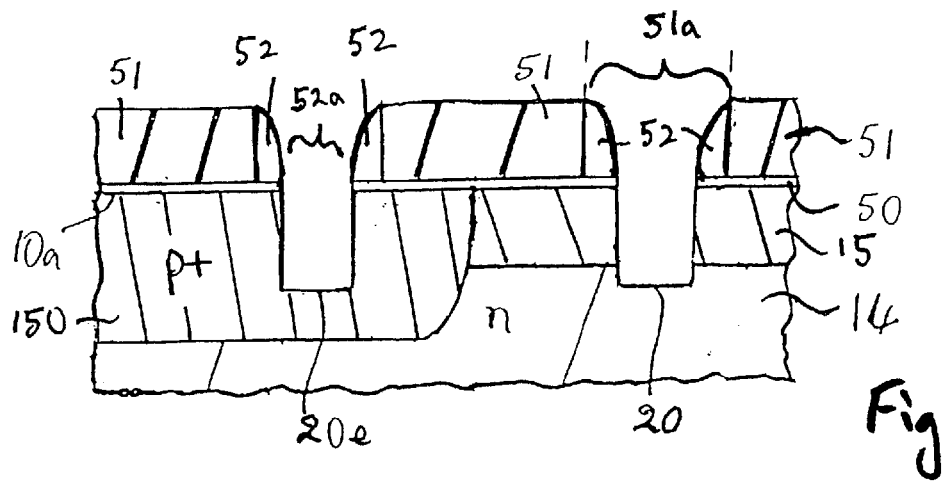

The device of FIGS. 1 to 5 is manufactured by a method which is in accordance with the present invention and which includes (in broad overview) the following stages:

(a) providing in a portion of the drain region 14 adjacent to a surface 10a of a semiconductor wafer body 100 (that provides the device body 10) the P+ end region 150, see FIG. 6;

(b) providing on the surface 10a a trench-etch mask 51 (FIG. 7) having windows 51a there-through where the gate trench 20 and end trench 20e are to be etched into the body, the end trench 20e being an extension of the gate trench 20 into the P+ region 150;

(c) etching the gate trench 20 and end trench 20e into the body 100, see FIG. 8;

(d) providing the gate dielectric layer 17 (FIG. 9) at the sidewalls of the gate trench 20 and end trench 20e, the gate dielectric layer 17 having a smaller thickness than the trench-etch mask 51, (e) providing gate material 11' (also FIG. 9) in the gate trench 20 and end trench 20e and extending through the windows 51a onto an upper surface of the trench-etch mask 51;

(f) patterning the gate material 11' by etching away areas thereof (FIG. 10) to leave the gate material
in the gate trench 20 to form the trench-gate 11,
in the end trench 20e and in the associated window 51a to form extension 11e of the trench-gate,
and on an adjacent area 51e of the trench-etch mask 51 to form conductive layer 11c that is connected to the gate extension 11e and that has a lateral extent terminating in an edge 11a, 11b on the trench-etch mask; and (g) completing the device manufacture by, inter alia, using the trench-etch mask 51 and its windows 51a to provide the source region 13 and/or an insulating capping layer 18 on the trench-gate 11 in a self-aligned manner with respect to the gate trench 20. An extension 18e of layer 18 may form an interlayer dielectric on the end structure.

Figure 5:
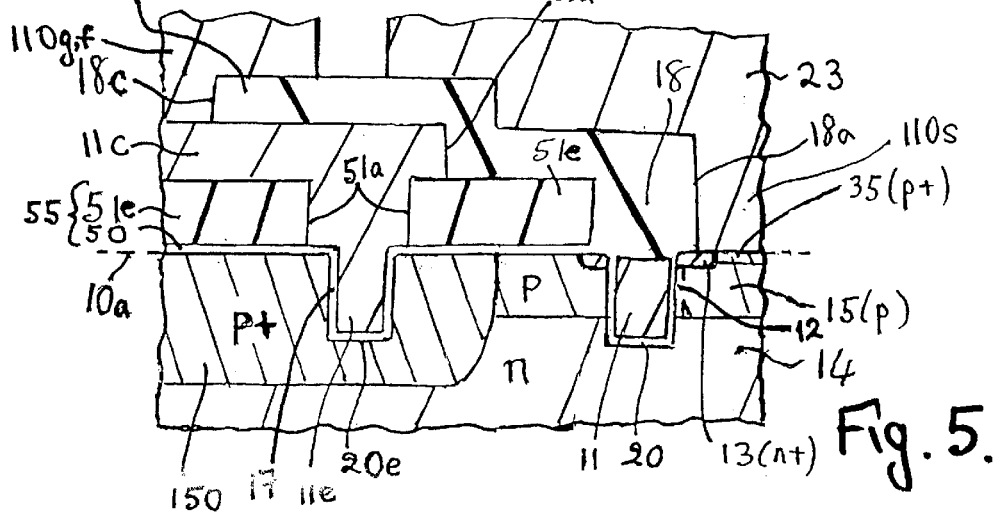

Detailed processing stages in manufacturing the device embodiments of FIGS. 1 to 5 will now be described with reference to FIGS. 6 to 11. These FIGS. 6 to 11 focus on the area of end structure (for device termination or gate bus-bar) that is shown in FIG. 5.

FIG. 6 illustrates stage (a) with boron ion implantation 60 to form the P+ region 150 in a part of an n-type epitaxial layer 14' that is to provide the drain-drift region 14. As usual, this implantation is effected through a thin oxide layer 50 (commonly termed "screen ox") on the body surface 10a. The lateral extent of the region 150 is defined by an implantation mask 55, for example of photoresist. In a specific example, a boron dose of about $5 \times 10^{13}$ cm$^{-2}$ ions may be implanted at an energy of about 250 keV. The dose and energy are chosen such that the resulting region 150 is more highly doped (P+) than the channel-accommodating region 15 and extends deeper in the body 10 than the trench 20e and the region 15.

In a specific example, the regions may have doping concentrations and depths as follows. The doping n of the drain drift region 14 may be about $2 \times 10^{16}$ or $3 \times 10^{16}$ phosphorus or arsenic cm$^{-3}$. The doping of P+ region 150 may be about $10^{18}$ boron cm$^{-3}$, whereas that of the channel-accommodating region 15 is typically about $10^{17}$ boron cm$^{-3}$. The depth (from the surface 10a) of P+ region 150 may be as much as 2.5 $\mu$m (micrometres), for example approaching twice that of the region 15 for a trench-gate depth of about 1.5 $\mu$m or 1.7 $\mu$m. Preferably there is at least about 0.5 $\mu$m of the P+ region material under the trench 20e. In the blocking state of the device, the greater doping and depth of the P+ region 150 pushes the depletion layer (in region 14) further towards the substrate 14a in this end area, as compared with the active cell areas CA. Thus, the end structure of FIG. 5 can have a slightly lower breakdown voltage, so protecting the active trench network in the cellular areas CA.

The layers 55 and 50 are removed after the FIG. 6 stage, and the field insulator 155 is then provided at the body surface 10a. This field insulator 155 is provided at least in the device termination area (FIG. 2). It may be provided also as a stripe in the gate bus-bar area (FIG. 3), or it may be omitted from the FIG. 3 area. Typically, there is an area of field insulator beneath where the gate-terminal bond-pad will be provided, for example in the peripheral area PA. The field insulator 155 is not shown in FIGS. 5 to 13, for convenience of drawing area. It is illustrated in FIGS. 2 and 3 as a layer deposited on the body surface 10a. This deposited layer is typically of silicon dioxide having a thickness in excess of 0.5 $\mu$m. Its length in the device termination area (FIG. 2) depends on the specific field-plate construction required in that area. In a specific example, the field insulating layer 155 may be between 30 $\mu$m and 40 $\mu$m long here. A smaller part 155 may be included in the bus-bar area, i.e. narrow enough to underlie the stripe-shaped mask area 51e (FIG. 3).

The field insulator 155 is preferably of deposited material, rather than a thermally grown (LOCOS) oxide. Deposition of the material has less effect on the boron doping concentration of the underlying P+ region 150. Thus, the Applicants find that the oxidation needed to form a thick LOCOS field oxide can extract boron from the P+ region 150, which may cause undesirable spread of the depletion layer to the end trench 20e in a blocking state of the device. If it is desired to use LOCOS for the field insulator 155, then a higher boron doping concentration needs to be provided in FIG. 6 stage.

Figure 7:
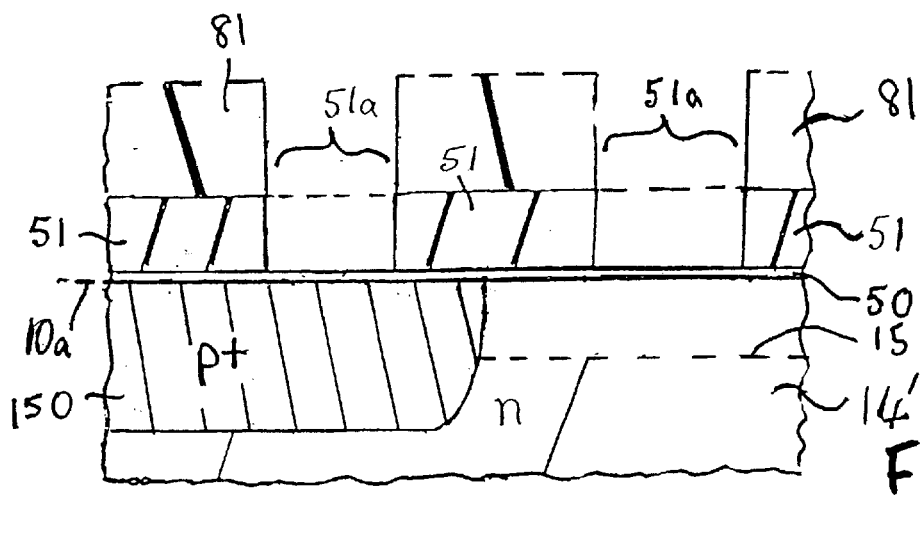

FIG. 7 illustrates the stage (b) provision of the trench-etch mask 51. A broken line associated with reference 15 in FIG. 7 indicates that the p-type channel region 15 may be provided either before the trench-etch mask 51 or at a later stage in the manufacture, depending on the technology used. Thus, for example, a further boron implant of lower dose and lower energy can be carried out before the FIG. 7 stage. This further boron implant can be masked by the field insulator 155, and so it can provide the doping for the channel-accommodating cell regions 15 in the areas CA and for the perimeter region 145 (FIG. 2) in the peripheral area PA. In this case, the perimeter region 145 (FIG. 2) is of opposite conductivity type to the drain drift region 14, and its potential will float close to that of the drain drift region 14. Indeed, the p-n junction between the regions 145 and 14 can be short-circuited effectively by a saw-cut used to sever the wafer body 100 into the individual device bodies 10 at the edge line 10e.

The trench-etch mask 51 can be provided in known manner from, for example, a thick silicon nitride layer deposited on a thin oxide layer 50 on the body surface 10a and on the field insulator 155. This thin oxide layer was a freshly grown "screen ox" that serves to reduce strain between the thick silicon nitride and the silicon surface 10a. It is given the same reference 50 as that of FIG. 6, as are subsequently renewed "screen ox" layers in later stages of the manufacture. Typically the oxide layer 50 is about 55 nm (nanometres) thick, whereas the nitride layer may be at least 0.5 $\mu$m thick.

A photoresist mask 81 is provided on the nitride layer to define, by known photolithographic and etching techniques, the windows 51a that are then etched to pattern the nitride into the nitride mask 51. In the specific examples illustrated in FIGS. 1 to 13, these windows 51a are the same width both in the cellular areas CA (where gate trenches 20 are to be etched through regions 15) and in the end structures (where end trenches 20e are to be etched into regions 150). In a specific example, the windows 51a may be about 0.5 $\mu$m wide.

The pattern of windows 51a determines the cellular geometry, pitch and layout of the individual transistors cells in areas CA. No plan view of the cellular layout geometry is shown in the drawings, because the present invention can be incorporated in devices and manufacturing processes having quite different, known cell geometries. Thus, for example the cells may have a close-packed hexagonal geometry, for example as depicted in JP-A-2001-24193, or they may have a square geometry or an elongate stripe geometry. In each case, the trench 20 (with its gate 11) extends around the boundary of each cell. It should be noted that the gate bus-bar cross-section of FIG. 3 (and also FIG. 16) shows cross-sections across several active device cells in the area CA, as well as across the bus-bar stripe. Such a view is appropriate to hexagonal or square cells. The person skilled in the art will appreciate that, with cells of elongate stripe geometry, then the bus-bar stripe will preferably be orientated perpendicular to the elongate stripe cells. In this case, the cross-section of FIG. 3 (and also FIG. 16) across the bus-bar stripe will be across its end trench 20e and the neighbouring end gate-trench 20 (only active on the CA side), and then this cross-section will be along the length of the elongate active cell (or along its elongate gate-trench 20).

The spacer technology disclosed in U.S. Pat. No. 6,087,224 is now used to narrow the windows 51a and to provide self-aligned process features for the trenches 20,20e, the source regions 13 and the oxide capping layer 18.

Thus, an oxide layer is now contour deposited on the top and sidewalls of the nitride mask 51 and at the bottom of the window 51a. This deposited oxide layer is then etched back in known manner, using a directional etch, so as to remove it from the top of the nitride mask 51 and from the bottom of the window 51a, while leaving it as side-wall spacers 52 in the window 51a. These spacers 52 are illustrated in FIG. 8. The etch-back also removes the exposed thin oxide layer 50 from the narrowed window 52a/51a.

Typically, the contour-deposited oxide layer may be about 0.2 $\mu$m thick, so that the spacers 52 left at the side walls of the windows 51a reduce the window width to a dimension 52a in the range of 0.1 $\mu$m to 0.2 $\mu$m. The trenches 20 and 20e are now etched into the body 100 at the narrowed window 52a/51a. In a specific embodiment, the depth to which the trenches 20 and 20e are etched may be, for example, about 1.5 $\mu$m. The trench 20,20e (about 0.2 $\mu$m wide) is considerably narrower than the window 51a (about 0.5 $\mu$m wide).

Figure 9:
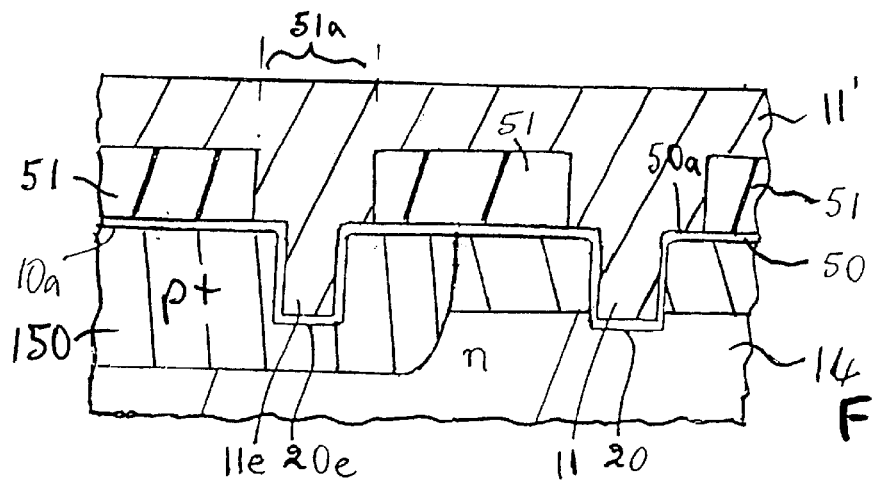
Figure 10:
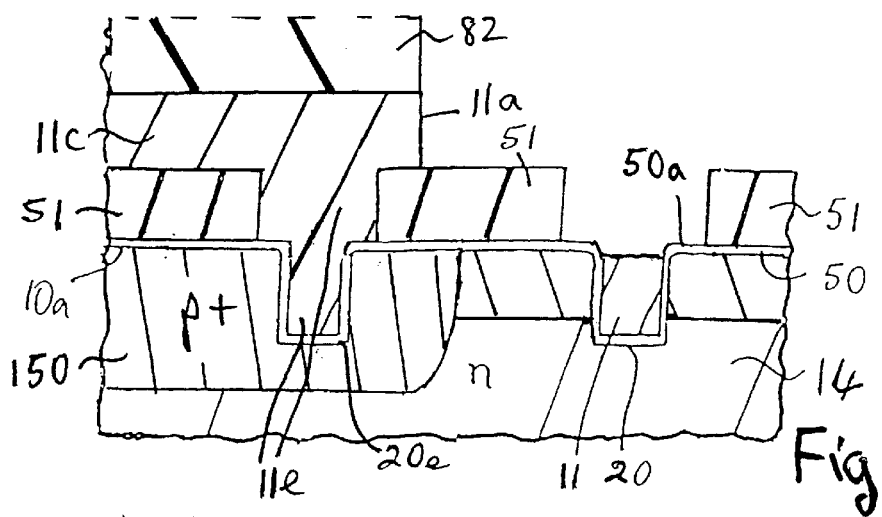

FIGS. 9 and 10 illustrate the next stage of providing the insulated gate structure. In this particular embodiment, the oxide spacers 52 are first etched away to re-open the wide window 51a. Gate dielectric 17 is then formed, for example by thermal oxidation of the silicon body portion at the walls of the trench 20, 20e. This step also provides a renewed area of screen oxide 50a at the surface 10a in the window 51a. Thereafter, gate material 11' is deposited to a thickness that is sufficient to fill the trench 20, 20e and to extend above the window 52a and over the mask 51. FIG. 9 shows the resulting structure.

A photoresist mask 82 is then provided on the gate material 11' to keep the gate extension parts 11e and 11c/11f in and around the end trench 20e while etching back the gate material 11' to form the trench-gate 11 in gate trench 20. FIG. 10 shows the resulting structure. Except for the mask 82, this etch-back definition of the gate 11 is in accordance with the disclosure in U.S. Pat. No. 6,087,224. The structure of FIG. 10 may now be processed further in accordance with U.S. Pat. No. 6,087,224, for example, to provide the source region 13 and gate-capping layer 18 in a self-aligned manner with respect to the narrow gate trench 20. The parts 11e and 11c/11f mask the end trench 20e and the adjacent portion of the body 100 from this further processing.

Figure 11:
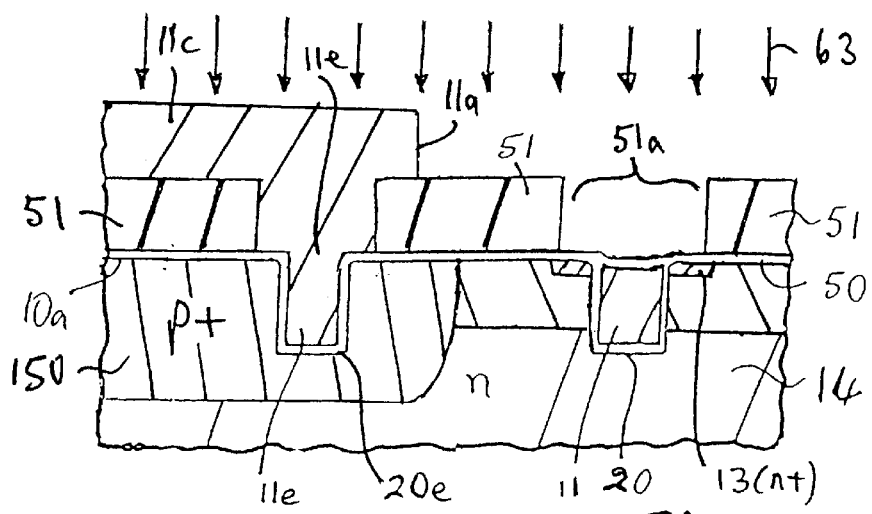

Thus, as illustrated in FIG. 11, the doping concentration n+ of source region 13 can now be introduced into the body 100 via the window 51a. This source doping is preferably carried out by implantation of arsenic ions 63. Typically, a very high dose is used to provide a doping concentration of $10^{20}$ to $10^{22}$ arsenic atoms $cm^{-3}$. The ion energy may be about 30 keV. The nitride layer 51 and gate extension parts 11e and 11c/11f mask the implantation. Typically, gate 11 and extension parts 11e and 11c/11f comprise doped polysilicon of the first conductivity type (n-type in this example), and so the implanted source doping 63 merely increases the conductivity of these polysilicon parts.

The insulating overlayer 18 may now be provided in a self-aligned manner over the trench-gate 11 in accordance with U.S. Pat. No. 6,087,224. Synergy with the present invention is possible, in that the same processing steps may be used with photolithographic definition of an insulating overlayer 18e over gate extension parts 11e and 11c/11f. FIGS. 2, 3 and 5 illustrate a deposited overlayer 18e of, for example, silicon dioxide that can be an extension of a deposited overlayer 18 on the trench-gates 11. This overlayer extension 18e has an inter-connect window 18c therein, where the subsequently-provided metal runners 110f and 110g are to contact the polysilicon parts 11c and 11f. The deposited oxide 18e also covers edge parts of the nitride mask area 51a that are not covered by the gate extension parts 11e and 11c. Thus, the deposited oxide 18e protects the nitride mask area 51a when the nitride mask 51 and thin oxide 50 are subsequently etched away from the cellular areas CA. This deposited oxide 18e does not cover the perimeter region 145.

Processing may be continued in accordance with U.S. Pat. No. 6,087,224. Thus, the exposed areas of the nitride mask 51 can now be etched away to define source contact windows between the overlayer 18 on the gate trenches 20. Additional dopant of the second conductivity type (i.e. p-type) may then be introduced via these contact windows so as to form a more highly doped (P+) contact region 35 for the channel-accommodating region 15, see FIGS. 2, 3 and 5. This is preferably achieved by implanting boron ions, the dose being insufficient to over-dope the source region doping. Typically, this P+ doping concentration may be, for example, about $10^{19}$ boron atoms $cm^{-3}$. As illustrated in FIG. 2, a P+ contact region 35 may also be provided in the p-type perimeter region 145.

Thin oxide 50 is typically present at the implantation windows. A short dip etch may now be used to remove this exposed oxide layer 50 and so open fully the contact window 18a for the source electrode 33 and the perimeter window for the perimeter field-plate 110e. Some isotropic etch-back of the oxide layers 18 and 18e will occur (both vertically and laterally) during this removal of thin oxide layer 50.

Then, a metal layer 110 is deposited and defined in a photolithographic and etching step into the desired pattern of the perimeter field-plate 110e, the gate-connected runners 110f and 110g and at least a lower part 110s of the source electrode 23.

FIGS. 2 and 3 illustrate a device in which the metal bus-bar runners 110g and a part of the metal field-plate runner 110f are overlaid with a thick upper part of the source electrode 23. In this case, an inter-level dielectric layer 180 of, for example, silicon dioxide is deposited. This dielectric layer 180 is defined in a photolithographic and etching step into the desired pattern that covers the metal layer parts 110e, 110f and 110g but exposes the lower part 110s of source electrode 23 and a gate bond-pad area of parts 110f and 110g. Then an upper metal 210 is deposited and patterned to form a source-terminal bond-pad 210s of the source electrode 23 and optionally a gate-terminal bond-pad 210g.

The back surface 10b is then metallised to form the drain electrode 34, after which the wafer body 100 is divided into the individual device bodies 10.

It will be evident that many modifications and variations are possible within the scope of the present invention. Considerable flexibility is possible in the specific technologies and constructions that can be used in providing and defining the regions and layers 14, 155, 150, 50, 51, 17,11, 110, 180, etc.

One simple modification is to use the metal layer 110 for both source and gate terminal bond-pads, i.e. not requiring a higher level of metal nor the inter-level dielectric layer 180. Thus, for example, inter-level dielectric layer 180 is omitted in the FIG. 5 illustration. In this case, a device having the FIG. 1 layout could have three source electrode areas 23 (110s) each providing a respective terminal bond-pad. These three source bond-pads would overlie the three cellular areas CA of FIG. 1 and be connected to the device-package source-terminal lead by three respective bond wires or connection straps. Alternatively, there could be a gap (discontinuity) in each of the two gate bus-bar stripes of FIG. 1, so that the three source electrode areas 23 (110s) could be connected with each other by parts of the lower metal 110s at these gaps (discontinuities).

Figure 12:
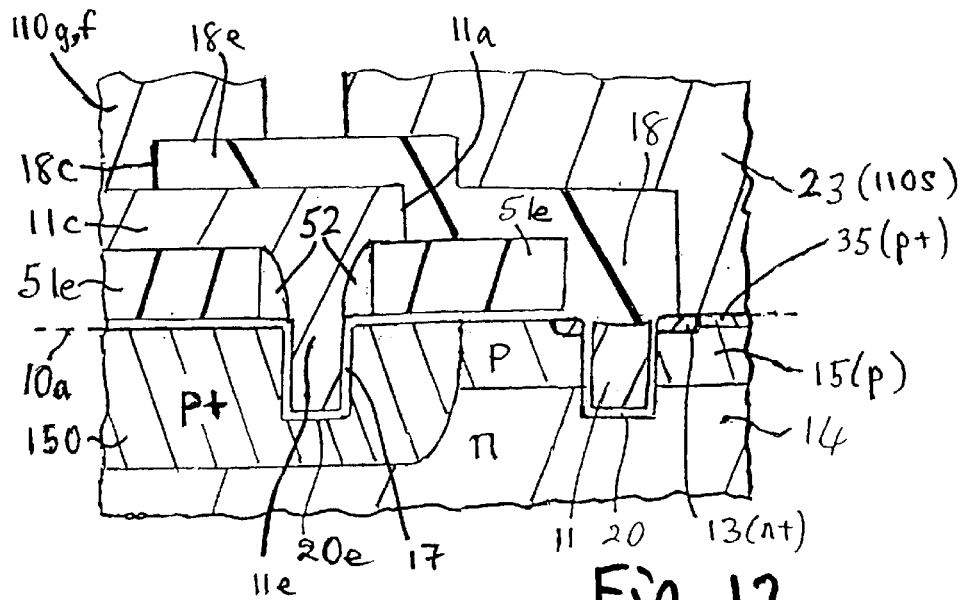
FIGS. 12 and 13 are cross-sectional views of a device part similar to that of FIG. 5, but showing modifications that are also in accordance with the present invention.
Figure 13:
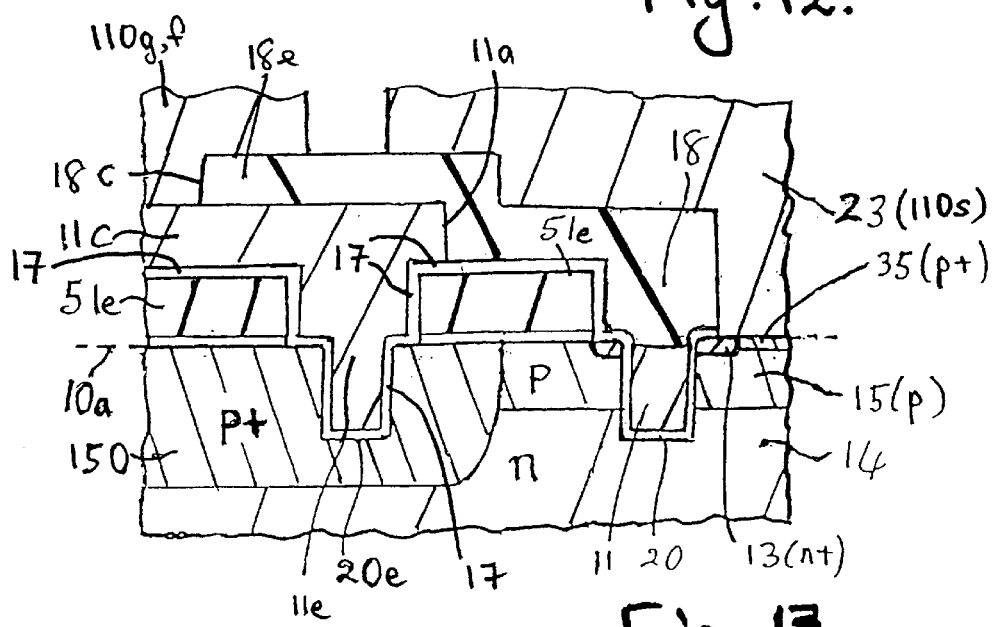

In the embodiment of FIGS. 5 and 9, the spacers 52 were removed before providing the gate dielectric layer 17 and gate material 11'. However, a modification is possible in which the spacers 52 are kept at this stage, so being present in the windows 51a in FIGS. 9 and 10. This modification has the following advantages. These spacers 52 are more rounded than the adjacent sidewall of the mask 51 and so provide a smoother contour for coverage by the extension 11e of the gate material from the trench 20e onto the mask top. At the FIG. 10 stage, the oxide spacers 52 adjacent to the top of the gate trench 20 protect the adjacent gate dielectric 17 during the etch-back of the gate material 11'. At the FIG. 11 stage, the exposed spacers 52 at the gate trench 20 may be etched away before the source doping 63. FIG. 12 illustrates the final device structure, in which the oxide spacers 52 are still present at the nitride window 51a from which the end trench 20e extends into the P+ region 150.

In FIG. 11, the source region 13 is formed by implanting dopant ions 63 at the re-opened window 51a, i.e. after spacer removal. However, the spacers 52 may be used in other ways to provide self-alignment of the source region 13 with the narrow trench-gate 11. In one such alternative way, the source region 13 may be diffused into the body 100 from an arsenic or phosphorus doping in the spacers 52 themselves. In another alternative way, the source region 13 may be formed from an n-type layer 13' at the surface 10a. This doped layer 13' can be provided before the mask 51, and then etching through the layer 13' to the underlying region 15 after providing the trench-capping layer 18.

In a further alternative form, the source dopant 63 may be implanted at the windows 51a at the FIG. 7 stage, so providing an initial source region 13' at the whole of this window 51a before forming the spacers 52. Thereafter, the spacers 52 are formed, and then the trench 20,20e is etched through region 13' at the narrowed window as in FIG. 8.

The embodiments of FIGS. 9 to 11 and FIG. 12 illustrate a thermal oxide as the gate-dielectric layer. However, the dielectric layer 17 could be deposited, which has the following advantage illustrated in final device structure of FIG. 13. In this case, the deposited layer 17 extends as a gate dielectric on the walls of the trench 20,20e and as a further insulation on the nitride trench-etch mask area 51a.

In the embodiments of FIGS. 1 to 13, the same thin gate-dielectric layer 17 lines the bottom as well as the sidewalls of the trench 20,20e. However, other embodiments are possible in which the trench 20,20e is slightly deeper and has thick insulating material deposited in its bottom. The thick insulator at the bottom of the gate-trench 20 reduces the gate-drain capacitance. The (much thinner) gate-dielectric layer 17 is then only present at the sidewalls of the trench 20,20e.

In the embodiments described, the mask 51 is composed of a single material (silicon nitride), other embodiments are possible in which composite layers of different materials are used. In this case, a thick composite mask 51 may be used at an early stage in the process, after which the mask 51 may be thinned by removal of an upper part. Even in the case when the original mask 51 of FIG. 3 is wholly of silicon nitride, oxy-nitride is formed at its surface when exposed to oxidising environments as the manufacturing process sequence progresses. Thus, for example, the nitride mask 51 may include a skin of oxy-nitride that is etched away when the oxide spacers 52 and/or oxide material 18' are etched, so thinning the mask 51 at these stages.

In the device termination structure of FIG. 2, the nitride mask area 51a covers the major area of the field oxide 155. This protects the field oxide 155 against thinning during the various etching treatments to which it could otherwise be exposed. The nitride mask area 51a also forms part of the thick field insulator. FIG. 14 illustrates a modification that is possible if a thicker initial oxide 155 is provided and/or different etching processes are used. In this modification, the nitride mask area 51a does not extend outside the outer perimeter 150b of the P+ end region 150. Both the field plates 11f and 110f now extend directly on the thick field-oxide 155. Thus, the outer perimeter 11b of the layer 11c terminates now on the thick field-oxide 155 rather than on the nitride mask area 51a.

FIG. 14 illustrates two further modifications in which the perimeter field-plate 110e is formed from a part 11x of the polysilicon layer 11, and in which the perimeter region 145' is a preformed highly-doped region (n+) of the same conductivity type as the drain drift region 14. Thus, FIG. 14 may be a view of these modifications taken at the FIG. 10 stage.

The polysilicon structure 11e, 11c, 11f and 11x of FIG. 14 may even be converted to a silicide with metal, instead of providing metal runners 110f and 110c on the polysilicon layers 11c, 11f.

However, a further modification of FIG. 14 is possible, in which both the field plates are formed from the metal layer 110 (as parts 110e and 110f'). Part 110f' is connected to the polysilicon layer 11c at the window 18c in the insulating overlayer extension 18e. In one form both the metal plates 11e and 110f' may extend directly on the thick field-oxide 155. The outer perimeter 11b of the layer 11c can then terminate again on the nitride mask area 51a. In another form, the metal field-plates 110e and 110f' may form a higher level of a stepped field-plate arrangement. In this case, the metal field-plates 110e and 110f' may extend on an insulating layer (e.g. 18e) over the thick field-oxide 155 and be connected to the polysilicon parts 11c and 11f at windows in this insulating layer. The polysilicon parts 11c and 11f form lower-level field-plates on the thick field-oxide 155.

An alternative and advantageous configuration for the field insulator 155 is illustrated in FIG. 15. Instead of depositing or thermally growing a field-insulator layer at the body surface 10a, the field-insulator 155 of FIG. 15 is deposited in a trench 120 that is deeper and wider than the trenches 20 and 20e. Thus, this insulator-filled trench 120 is deeper than the p-type end region 150 and defines the outer perimeter 150b of this region 150. Such a structure avoids high fields due to tight p-n junction curvature at the outer perimeter 150b in FIG. 2. The trench 120 is preferably etched before providing the gate-trench-etch mask area 51a of FIG. 7. Thus, it is etched in a separate stage from the trenches 20 and 20e associated with the trench-gate 11.

This FIG. 15 structure can be more compact than that of FIGS. 2, 3, and 14. It can be used as a modification with any of the previously described modifications. In a specific example, the width of the trench 120 may be between 3 μm and 5 μm in the device termination area PA, and perhaps narrower in the bus-bar area. Preferably, the bottom of this deep trench 120 comes close to the interface of the drift region 14 with its more highly doped region 14a, or it may even penetrate into the more highly doped region 14a. The use of such a deep and wide insulator-filled field trench 120 is novel in itself, regardless of whether any gate-trench-etch mask area 51a is retained in the device. It may even be used, for example, to replace the LOCOS field-insulator in the JP-A-2001-24193 trench-gate devices.

FIG. 16 illustrates an even more compact structure for the bus-bar area. No field-insulator 155 is included in this bus-bar area. FIG. 16 shows two end trenches 20e in the P+ region 150, but it is possible to have just one such trench 20e for an even more compact structure. Such modifications may be incorporated in previous embodiments, and so too may the gate-terminal bond-pad construction that is now to be described.

Thus, FIG. 16 also shows an advantageous gate-terminal bond-pad construction. Upper metal pattern 210 extends over the insulating layer 180 (over an area of the gate bus-bar structure) to provide metal source and gate pads 210s and 210g, respectively. The metal gate pad 210g contacts the metal track 110g of the bus-bar structure via a window 180c in the insulating layer 180. In this case, however, the metal gate pad 210g extends a significant lateral distance (on the insulating layer 180) over an underlying part 110s of the source electrode 23, and hence over many active device cells in area CA. Thus, less of the body layout area at the body surface 10a is affected by the overlying gate-terminal bond-pad. More of this body layout area can be used to accommodate active device cells. This gate-terminal bond-pad construction is novel in itself, regardless of whether any gate-trench-etch mask area 51a is kept in the device. It may even be used, for example, to replace the gate pad in the JP-A-2001-24193 trench-gate devices.

In the embodiments of FIGS. 2 to 16, spacers are used so that the trenches 20,20e are narrower than the etch-mask windows 51a. However, the present invention may be used without spacers, so forming devices in which the trenches 20,20e are about the same width as the etch-mask windows 51a. In the embodiments of FIGS. 2 to 16, the end trenches 20e are the same depth and width as the gate-trenches 20. This is the simplest and most reproducible arrangement for manufacture. However, the end trenches 20e may be of a depth and/or width that differs from that of the gate-trenches 20. Thus, for example, the end trenches 20e may be wider and even slightly deeper. The Applicants find that more optimum breakdown performance is achieved when the end trenches 20e are fully accommodated within a deeper P+ end region 150, as illustrated in FIGS. 2 to 16. However, the present invention may also be used with shallower P+ end regions, for example as in JP-A-2001-24193.

Many other modifications and variations will be apparent to the person skilled in the art.

Instead of forming the drain-drift region 14 by an epitaxial layer on a higher-doped substrate 14a, the higher doped region 14a of some devices may be formed by dopant diffusion into the back surface 10b of a high-resistivity substrate that provides the drift region 14. The devices so far described are MOSFETs in which the higher-doped substrate 14a or region 14a is of the same conductivity type (n-type in this example) as the drain drift region 14. However, the higher-doped substrate 14a or region 14a may be of opposite conductivity type (p-type in this example) to provide an IGBT. The electrode 24 is called an anode electrode in the case of an IGBT.

Vertical discrete devices have been described so far, having their second main electrode 24 contacting the substrate or other region 14a at the back surface 10b of the body 10. However, an integrated device is also possible in accordance with the invention. In this case, the region 14a may be a doped buried layer between a device substrate and the epitaxial low-doped drain region 14. This buried layer region 14a may be contacted by an electrode 24 at the front major surface 10a, via a doped contact region which extends from the surface 10a to the depth of the buried layer.

The particular examples described above are n-channel devices, regions 13 and 14 are of n-type conductivity, regions 15,150 and 35 are p-type, and an electron inversion channel 12 is induced in region 15 by the gate 11. By using opposite conductivity type dopants, a p-channel device can be manufactured by a method in accordance with the invention. In this case, the regions 13 and 14 are of p-type conductivity, the regions 15, 150 and 35 are n-type, and a hole inversion channel 12 is induced in the region 15 by the gate 11.

Semiconductor materials other than silicon may be used for devices in accordance with the invention, for example silicon carbide.

From reading the present disclosure, other variations and modifications will be apparent to persons skilled in the art. Such variations and modifications may involve equivalent and other features which are already known in the art and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

The Applicants hereby give notice that new claims may be formulated to any such features and/or combinations of such features during the prosecution of the present Application or of any further Application derived therefrom. Thus, two examples, will now be given:

Both examples relate to insulated-gate field-effect devices, for example MOSFETs, and so comprise an active device area having an insulated gate adjacent to a channel-accommodating region of a second conductivity type between source and drain regions that are of a first conductivity type. The drain region includes a drain drift region that separates a more highly doped portion (e.g. substrate) from the channel-accommodating region. The device is preferably of the trench-gate type, in which an insulated gate trench (accommodating the trench-gate) extends from the source region through the channel-accommodating region and into the underlying drain region. However, alternatively, the device may be of the so-called DMOS type, in which the insulated gate extends on the body surface between the source region and a surface-adjacent portion of the drain region.

The first example is a device termination structure (also useable for a gate bus-bar structure across the active device area) that extends around a perimeter of the active device area and that includes:

an end region (150) of the second conductivity type that is an extension of the channel-accommodating region (15) and has the same doping concentration or higher doping concentration than the channel-accommodating region (15), an extension (11e) of the insulated gate (11) into or on the end region (the extension being accommodated in an end trench (20e) that is an extension of the insulated gate trench (20) in the case of a trench-gate device), and a field insulator (155) that is accommodated within a field trench (120) that is located at the outer perimeter (150b) of the end region and that extends to a greater depth in the drain drift region (14) than the end region (150).

The field trench (120) may even extend through the drain drift region (14) to reach the higher doped portion (14a). The device may also include:

an outwardly-extending field-plate (11f, 110f) that extends over the field insulator (150) over a part of the drain region below the field trench (120) and that is connected to the insulated gate (11), e.g. to the trench-gate (11) via the end trench (20e) in a trench-gate device, and/or an inwardly-extending field-plate (11x, 110e) that extends over another part (51e) of the field insulator over a part of the drain region (14) beyond an outer perimeter of the field trench (150) and that is connected to a perimeter region (145) outside the outer perimeter of the field trench (150).

A specific embodiment of this first example is illustrated in FIG. 15. The reference signs in brackets refer to this embodiment, by way of a non-limiting illustration of a stated broad feature.

The second example is a gate-terminal bond-pad structure that extends over a part of the active device area and that includes:

a gate bus-bar (11c, 110g) extending at least partly across the active device area (CA) and including a metal track (110g) that is connected to the gate (11) in the active device area to provide a gate connection of reduced electrical resistance, an overlying insulating layer (180) that extends over the gate bus-bar to insulate the gate bus-bar from an overlying lower metal portion (110s) of a source electrode (23) that is connected to the source region (13), an upper metal pattern (210s, 210g) extends over the overlying insulating layer (180) to provide metal source and gate pads (210s, 210g), the metal gate pad (210g)

contacting the metal track (110g) of the bus-bar via a widow (180c) in the said overlying insulating layer (180), and the metal gate pad (210g) extending laterally on the said overlying insulating layer (180) over an underlying part (110s) of the source electrode (23) over the active device area (CA).

A specific embodiment of this second example is illustrated in FIG. 16. The reference signs in brackets refer to this embodiment, by way of a non-limiting illustration of a stated broad feature.

What is claimed is:

1. A cellular trench-gate semiconductor device comprising active device cells in a cellular area of a semiconductor body, wherein each active device cell has a channel-accommodating region of a second conductivity type between a surface-adjacent source region and an underlying drain region that are of a first conductivity type, an insulated gate trench accommodating the trench-gate extends from the source region through the channel-accommodating region and into the underlying drain region, the trench-gate being dielectrically coupled to the channel-accommodating region by an intermediate gate dielectric layer at sidewalls of the gate trench, and at least one group of the cells end in a respective end structure including:

an end region of the second conductivity type having a higher doping concentration than the channel-accommodating region, an end trench that is an extension of the insulated gate trench into the end region and that accommodates an extension of the trench-gate, and a conductive layer that is connected to the extension of the trench-gate and extends over an intermediate insulating layer over the end region, which device is characterised in that the intermediate insulating layer comprises an area of a trench-etch mask that is of greater thickness than the gate dielectric layer, a window extends through the trench-etch mask at a location where the end trench extends into the body and where the conductive layer is connected to the trench-gate extension, and the conductive layer has a lateral extent that terminates in an edge on the trench-etch mask.

2. A device according to claim 1, wherein the respective end structure extends between two groups of active device cells as a stripe structure across a part of the cellular area of the device, the trench-gate, its extension and the conductive layer are of conductive semiconductor material, and a metal track extends on the conductive semiconductor material on the trench-etch mask to provide a gate connection of reduced electrical resistance for the two groups of active device cells.

3. A device according to claim 1, wherein the respective end structure extends around a perimeter of the cellular area of the device as a device termination structure, the end region has an outer perimeter that terminates in a field insulator onto which the trench-etch mask extends, and an outwardly-extending field-plate extends over the field insulator over a part of the drain region outside the outer perimeter of the end region and is connected to the trench-gate via the conductive-layer connection.

4. A device according to claim 2, having a first respective end structure (FIG. 2) that extends around a perimeter of the cellular area as a device termination structure and a second respective end structure (FIG. 3) that extends as a stripe structure across a part of the cellular area, wherein an area of the field insulator is present under the trench-etch mask under the metal track of the stripe structure.

5. A device according to claim 2, wherein the metal track (110g) of the stripe structure is insulated by an overlying insulating layer (180) from a source electrode (23, 210s).

6. A device according to claim 5, wherein an upper metal pattern extends over the overlying insulating layer to provide metal source and gate pads, the metal gate pad contacts the metal track of the stripe structure via a widow in the said overlying insulating layer, and the metal gate pad extends laterally on the said overlying insulating layer over an underlying part of the source electrode.

7. A device according to claim 3, wherein an inwardly-extending field-plate (110e) is connected to a perimeter region (145) outside an outer perimeter of the field insulator (155) of the device termination structure.

8. A device according to claim 7, wherein the inwardly-extending field-plate extends over the outer perimeter of the field insulator and onto a further insulating layer over the field insulator of the device termination structure.

9. A device according to claim 3, wherein the field insulator comprises deposited material over at least most of its thickness.

10. A device according to claim 3, wherein the field insulator (155) of the device termination structure comprises deposited insulating material accommodated within a field trench (120) that is located at the outer perimeter of the respective end region (150) and that extends to a greater depth in the body than the respective end region.

11. A device according to claim 1, wherein the trench-etch mask (51) comprises silicon nitride.

12. A device according to claim 1, wherein the gate dielectric layer (17) comprises a deposited material, an area of which is present on the area of the trench-etch mask (51) below the conductive layer (11c).

13. A device according to claim 1, wherein the conductive layer (11c) is an extension of gate material (11) from the end trench (20e) onto the insulating layer.

14. A device according to claim 1, wherein both the end trench (20e) and gate trench (20) are narrower than the window (51a) in the trench-etch mask.

15. A device according to claim 14, wherein the trench-etch mask has sidewall extensions of a different insulating material at the window so narrowing the window to a width smaller than that of the end trench, the sidewall extensions are more rounded than the adjacent sidewall of the trench-etch mask, and the extension of the trench-gate extends from the end trench over these more rounded sidewall extensions and onto the trench-etch mask.

16. A device according to claim 1, wherein the end trench (20e) and gate trench (20) are of the same depth.

17. A device according to claim 1, wherein the end trench (20e) extends to a shallower depth than the end region (150) and is accommodated wholly within the end region.

* * * * *